US011762015B2

United States Patent
Jiang et al.

(10) Patent No.: US 11,762,015 B2
(45) Date of Patent: Sep. 19, 2023

(54) FULL-PATH CIRCUIT DELAY MEASUREMENT DEVICE FOR FIELD-PROGRAMMABLE GATE ARRAY (FPGA) AND MEASUREMENT METHOD

(71) Applicant: SHANGHAITECH UNIVERSITY, Shanghai (CN)

(72) Inventors: Weixiong Jiang, Shanghai (CN); Yajun Ha, Shanghai (CN)

(73) Assignee: SHANGHAITECH UNIVERSITY, Shanghai (CN)

( * ) Notice: Subject to any disclaimer, the term of this patent is extended or adjusted under 35 U.S.C. 154(b) by 0 days.

(21) Appl. No.: 17/801,266

(22) PCT Filed: Sep. 22, 2021

(86) PCT No.: PCT/CN2021/119511
§ 371 (c)(1),
(2) Date: Aug. 22, 2022

(87) PCT Pub. No.: WO2022/227382
PCT Pub. Date: Nov. 3, 2022

(65) Prior Publication Data
US 2023/0194602 A1    Jun. 22, 2023

(30) Foreign Application Priority Data
Apr. 29, 2021   (CN) .......................... 202110473251.1

(51) Int. Cl.
*G01R 31/317* (2006.01)
(52) U.S. Cl.
CPC .............. *G01R 31/31725* (2013.01)
(58) Field of Classification Search
CPC ............................................. G01R 31/31725
(Continued)

(56) References Cited

U.S. PATENT DOCUMENTS 8,816,743 B1 *   8/2014   Lu ........................... H03K 5/135
                                                          327/292
2010/0264903 A1 * 10/2010   Canac ................... H03L 7/0814
                                                          324/76.77
(Continued)

FOREIGN PATENT DOCUMENTS

CN      101581762 A    11/2009
CN      110442012 A    11/2019
(Continued)

OTHER PUBLICATIONS

Kang Yanfei, et al., The detection of delay defects in FPGA based on boundary scan, Basic Sciences Journal of Textile Universities, 2017, pp. 396-401, vol. 30, No. 3.
(Continued)

*Primary Examiner* — Jermele M Hollington
*Assistant Examiner* — Robert P Alejnikov, Jr.
(74) *Attorney, Agent, or Firm* — Bayramoglu Law Offices LLC

(57) ABSTRACT

A full-path circuit delay measurement device for a field-programmable gate array (FPGA) and a measurement method are provided. The measurement device includes two shadow registers and a phase-shifted clock, where the two shadow registers take an output of a measured combinational logic circuit as a clock and sample the phase-shifted clock SCLK as data; the two shadow registers are respectively triggered on rising and falling edges of the output of the measured combinational logic circuit to sample the phase-shifted clock; outputs of the two shadow registers are delivered by an OR gate as an input into a synchronization register; a clock of the synchronization register serves as a clock MCLK of the measured combinational logic circuit; an output of the synchronization register serves as that of the circuit delay measurement device; the phase-shifted clock (Continued)

SCLK and the clock MCLK of the measured combinational logic circuit have the same frequency.

2 Claims, 3 Drawing Sheets

(58) Field of Classification Search
USPC .................................................. 324/762.01
See application file for complete search history.

(56) References Cited

U.S. PATENT DOCUMENTS

2011/0095768 A1\* 4/2011 Cheung ............ G01R 31/31725
324/617
2012/0043982 A1\* 2/2012 Carpenter ........ G01R 31/31725
324/750.3

FOREIGN PATENT DOCUMENTS

| CN | 113125944 A | 7/2021 |
| JP | 2001349933 A | 12/2001 |
| JP | 2008076121 A | 4/2008 |

OTHER PUBLICATIONS

Joshua M. Levine, et al., Online Measurement of Timing in Circuits: for Health Monitoring and Dynamic Voltage & Frequency Scaling, IEEE, 2012.
Ibrahim Ahmed, et al., Automatic BRAM Testing for Robust Dynamic Voltage Scaling for FPGAs, IEEE, 2018.

\* cited by examiner

FULL-PATH CIRCUIT DELAY MEASUREMENT DEVICE FOR FIELD-PROGRAMMABLE GATE ARRAY (FPGA) AND MEASUREMENT METHOD

CROSS REFERENCE TO THE RELATED APPLICATIONS

This application is the national phase entry of International Application No. PCT/CN2021/119511, filed on Sep. 22, 2021, which is based upon and claims priority to Chinese Patent Application No. 202110473251.1, filed on Apr. 29, 2021, the entire contents of which are incorporated herein by reference.

TECHNICAL FIELD

The present invention relates to a measurement technology, and in particular to a full-path circuit delay measurement device for a field-programmable gate array (FPGA) and a measurement method.

BACKGROUND

The dynamic power consumption of a complementary metal oxide semiconductor (CMOS) circuit is proportional to the square of voltage drain-to-drain (Vdd). Dynamic voltage scaling (DVS) technology reduces dynamic power consumption by reducing Vdd to the lowest frequency that maintains safe operation of the circuit. However, since the critical paths of FPGAs are application-related and hard to predict during design, the DVS technology has not been widely used on FPGAs. Therefore, a real-time and accurate delay measurement technique is required to protect the safe operation of the circuit.

Ahmed et al. proposed a circuit delay measurement technique that can measure arbitrary paths offline (Ibrahim Ahmed, et al. *Automatic BRAM Testing for Robust Dynamic Voltage Scaling for FPGAs*. FPL, pp: 68-75. IEEE, 2018). This technique generates multiple calibrated bitstreams, recording the delay of each path at each voltage. However, this calibration table-based technique cannot cover all operating conditions, so when the operating environment is inconsistent with the calibration environment, the calibration information will become invalid.

SUMMARY

The present invention proposes a full-path circuit delay measurement device for an FPGA and a measurement method to ensure the operational reliability of the FPGA circuit. The present invention can measure the delay of any path in the FPGA in real time and can cover all working conditions, thereby ensuring the safe operation of the circuit in real time.

The present invention adopts the following technical solutions: A full-path circuit delay measurement device for an FPGA includes two shadow registers and a phase-shifted clock, where the two shadow registers take an output of a measured combinational logic circuit as a clock and sample the phase-shifted clock SCLK as data; the two shadow registers are respectively triggered on rising and falling edges of the output of the measured combinational logic circuit to sample the phase-shifted clock; outputs of the two shadow registers are delivered by an OR gate as an input into a synchronization register; a clock of the synchronization register serves as a clock MCLK of the measured combinational logic circuit; an output of the synchronization register serves as an output of the circuit delay measurement device; the phase-shifted clock SCLK and the clock MCLK of the measured combinational logic circuit have the same frequency and an adjustable phase difference.

A measurement method for the full-path circuit delay measurement device for the FPGA includes: gradually adjusting the phase difference between the phase-shifted clock SCLK and the clock MCLK of the measured combinational logic circuit from 0° to 360° at regular intervals; allowing, when the phase difference between the phase-shifted clock SCLK and the clock MCLK of the measured combinational logic circuit is small, a falling edge of the phase-shifted clock SCLK to arrive earlier than an edge of the combinational logic circuit, where the circuit delay measurement device gains a first sampling result of 0; allowing, when the phase difference between the phase-shifted clock SCLK and the clock MCLK of the measured combinational logic circuit gradually increases, the falling edge of the phase-shifted clock SCLK to arrive later than the edge of the measured combinational logic circuit, where the circuit delay measurement device gains a second sampling result of 1, and a transition point from 0 to 1 occurs, indicating that the falling edge of the phase-shifted clock coincides with an output edge of the measured combinational logic circuit; allowing, when the phase difference further increases, a rising edge of the phase-shifted clock SCLK to arrive after the edge of the measured combinational logic circuit, where the circuit delay measurement device gains a third sampling result of 0, and a transition point from 1 to 0 indicates that the rising edge of the phase-shifted clock coincides with the output edge of the measured combinational logic circuit; since a phase of the phase-shifted clock is known, a phase where a sampled value of the circuit delay measurement device is transitioned reflects a positional relationship between the edge of the measured combinational logic circuit and an edge of the phase-shifted clock, thereby indirectly measuring a delay of the measured combinational logic circuit.

The present invention has the following advantages: The full-path circuit delay measurement device for the FPGA and the measurement method of the present invention verifies the circuit delay measurement device on common benchmarks, and experimental data show that the present invention can accurately measure all types of paths at all voltages and frequencies, with an average measurement error of only 1.51%.

DETAILED DESCRIPTION OF THE EMBODIMENTS

The present invention will be described in detail in conjunction with the drawings and specific embodiments. The embodiments are implemented based on the technical solutions of the present invention. The following presents detailed implementations and specific operation processes.

The protection scope of the present invention, however, is not limited to the following embodiments.

Figure 1:
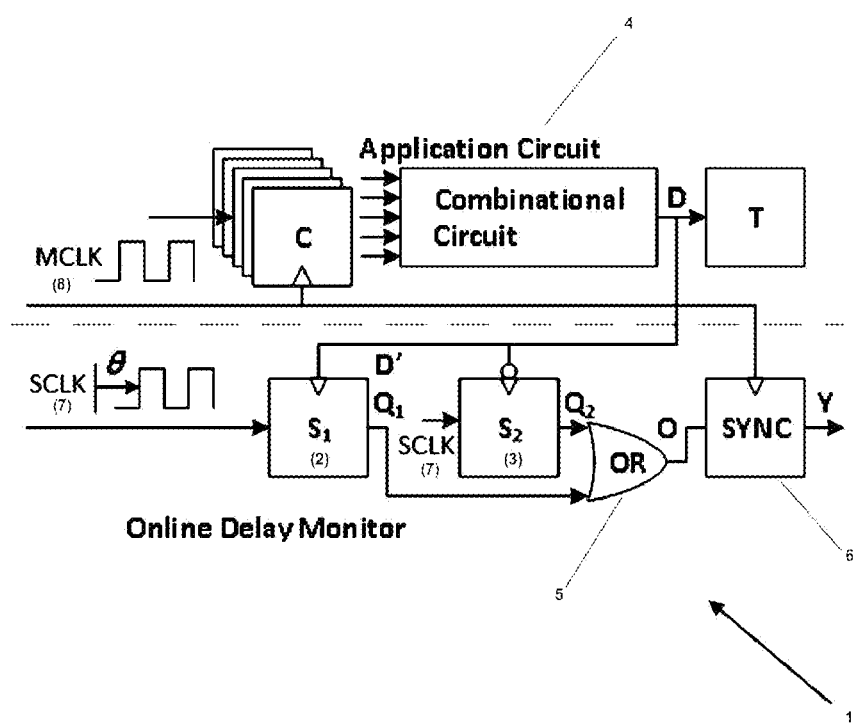
FIG. 1 is a structural diagram of a circuit delay measurement device according to the present invention.

The present invention proposes an on-line full-path circuit delay measurement device for an FPGA. As shown in FIG. 1, the measurement device (1) includes mainly two shadow registers and a phase-shifted clock. The two shadow registers (2, 3) take an output of a measured combinational logic circuit (4) as a clock and sample the phase-shifted clock SCLK (7) as data. The two shadow registers (2, 3) are respectively triggered on rising and falling edges of the output of the measured combinational logic circuit (D) to sample the phase-shifted clock. Outputs of the two shadow registers are delivered by an OR gate (5) as an input into a synchronization register (6). A clock of the synchronization register serves as a clock MCLK (8) of the measured combinational logic circuit. An output (Y) of the synchronization register serves as that of the circuit delay measurement device. The on-line circuit delay measurement device is used to measure a delay of the combinational logic circuit. The delay of the combinational logic circuit refers to a time lag between the edge of the combinational logic circuit and the rising edge of the clock MCLK of the combinational logic circuit.

Further referring to FIG. 1, during measurement, the phase difference between the phase-shifted clock SCLK (7) and the clock MCLK (8) of the combinational logic circuit is gradually adjusted from 0° to 360° at regular intervals. When the phase difference between the phase-shifted clock SCLK (7) and the clock MCLK (8) of the combinational logic circuit (4) is small, a falling edge of the phase-shifted clock SCLK can arrive earlier than an edge of the measured combinational logic circuit, where the delay measurement device gains a first sampling result of 0. When the phase difference between the phase-shifted clock SCLK (7) and the clock MCLK (8) of the measured combinational logic circuit (4) gradually increases, the falling edge of the phase-shifted clock SCLK (7) can arrive later than the edge of the measured combinational logic circuit (4), where the circuit delay measurement device (1) gains a second sampling result of 1. When the phase difference further increases, the rising edge of the phase-shifted clock SCLK (7) to can arrive later than the edge of the combinational logic circuit (4), where the circuit delay measurement device (1) gains a third sampling result of 0. Therefore, a phase at which a sampled value of the circuit delay measurement device (1) is transitioned reflects a positional relationship between the edge of the combinational logic circuit (4) and the edge of the phase-shifted clock (7), thereby indirectly measuring a delay of the measured combinational logic circuit (4).

With further reference to FIG. 1, the shadow registers (2, 3) take an output of the combinational logic circuit (4) as a clock and the phase-shifted clock (7) as data. Through the outputs of the shadow registers (2, 3), the sequence relationship between the rising edge of the phase-shifted clock (7) and the rising edge of the combinational logic circuit (4) is determined, and then the time of the rising edge of the combinational logic circuit (4) is indirectly measured. S1 (2) samples the rising edge, and S2 (3) samples the falling edge. Their outputs are delivered to the synchronization register SYNC (6) by the OR gate (5), which facilitates result acquisition. The phase-shifted clock SCLK (7) and the clock MCLK (8) of the measured combinational logic circuit (4) have the same frequency and an adjustable phase difference θ.

Figure 2:
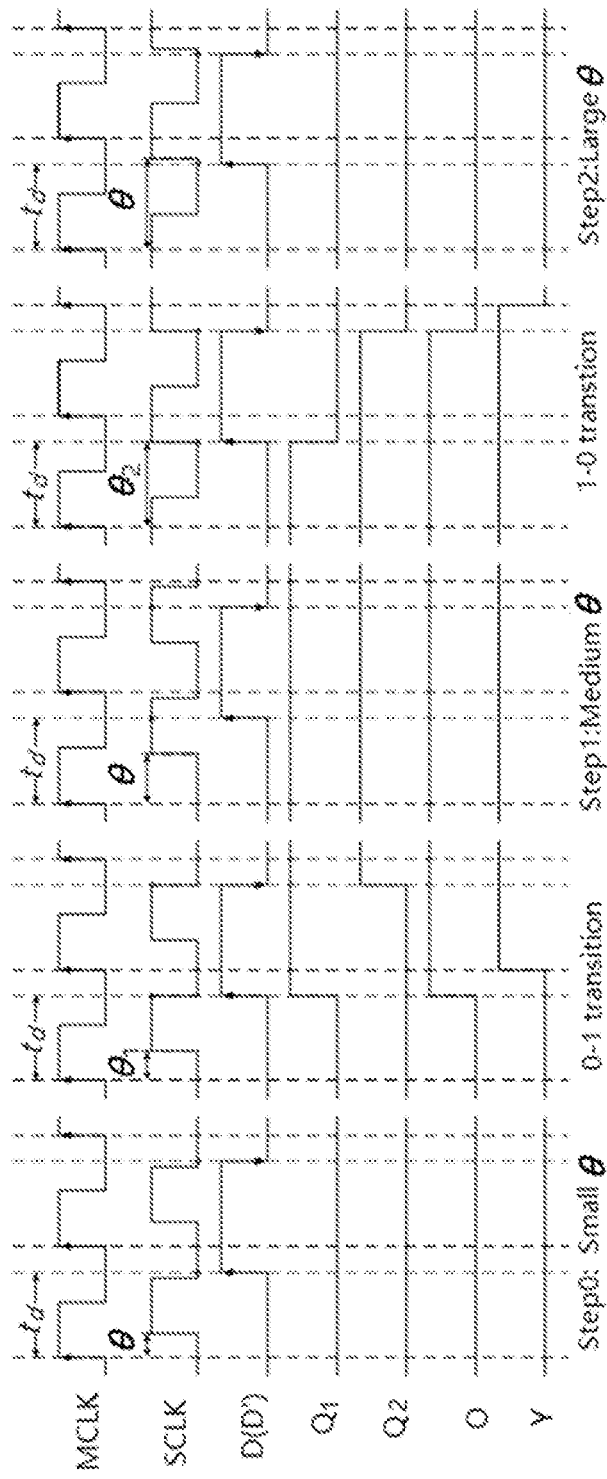
FIG. 2 is a working sequence chart of the circuit delay measurement device according to the present invention.

FIG. 2 shows a sequence chart of the measurement device. To measure the delay, the shadow register S1 is triggered by the rising edge of the output D of the measured combinational logic circuit and acquires a signal of the phase-shifted clock SCLK. The shadow register S2 is triggered by the falling edge of the output D of the measured combinational logic circuit and acquires a signal of the phase-shifted clock SCLK. In phase 0, the falling edge of SCLK arrives earlier than the edge of the combinational logic circuit. The data acquired by the two shadow registers are both 0, so their outputs Q1 and Q2 are 0 respectively. The output O of the OR gate is 0, and the output Y of the synchronization register SYNC is 0. In phase 1, the falling edge of SCLK arrives later than the edge of the combinational logic circuit. The data acquired by the two shadow registers are both 1, so their outputs Q1 and Q2 are 1 respectively. The output O of the OR gate is 1 and the output Y of the synchronization register SYNC is 1. In phase 2, the rising edge of SCLK arrives after the edge of the combinational logic circuit. The data acquired by the two shadow registers are both 0, so their outputs Q1 and Q2 are 0 respectively. The output O of the OR gate is 0 and the output Y of the synchronization register SYNC is 0. Therefore, the phase difference between the phase-shifted clock SCLK and the clock MCLK of the combinational logic circuit is gradually adjusted from 0 to 360 at regular intervals. The output Y of the measurement device is transitioned from 0 to 1 and then from 1 to 0. A transition point from 0 to 1 occurs, indicating that the falling edge of the phase-shifted clock coincides with the output edge of the combinational logic circuit. A transition point from 1 to 0 indicates that the rising edge of the phase-shifted clock coincides with the output edge of the combinational logic circuit. The phase of the phase-shifted clock is known, so the delay of the measured combinational logic circuit can be indirectly reflected by the phase of the phase-shifted clock where the transition point of the output of the measurement device is located.

Figure 3:
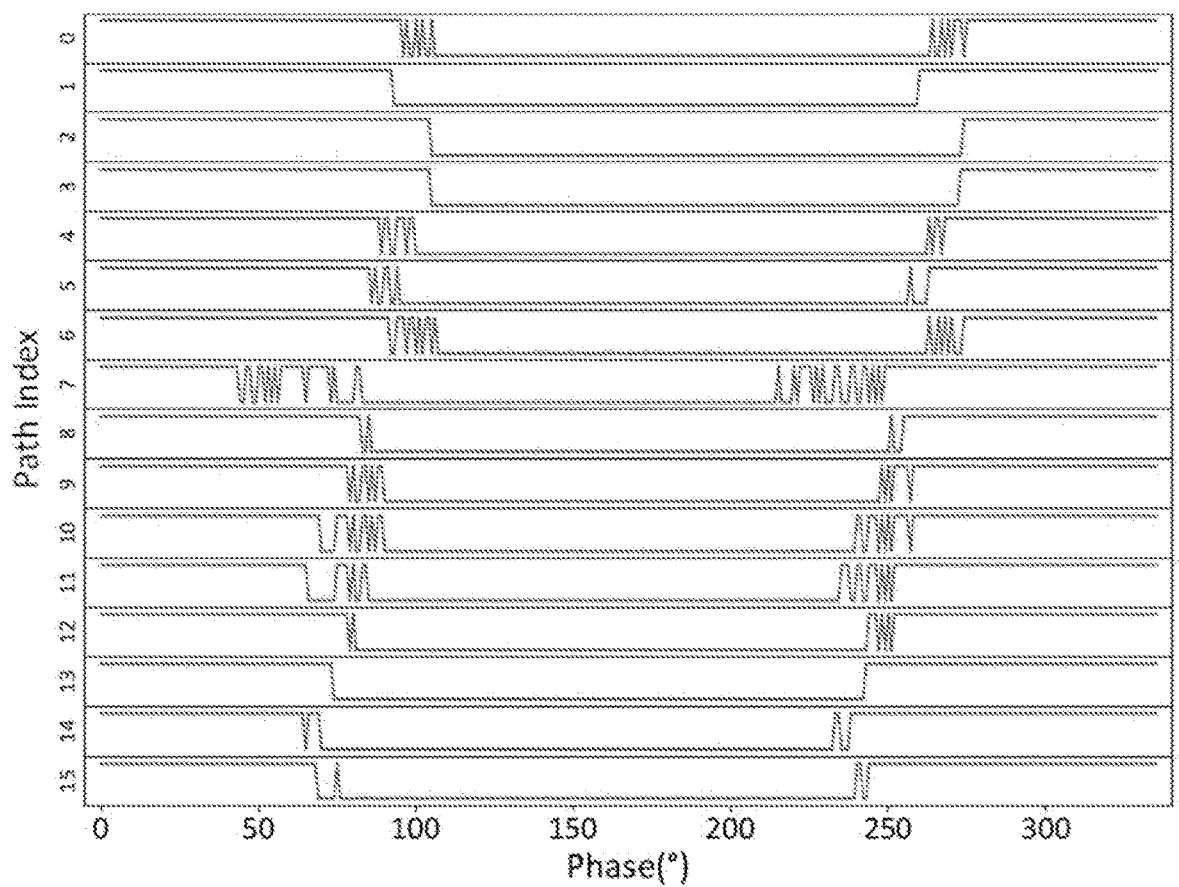
FIG. 3 is a result diagram of the circuit delay measurement device measuring 16 paths of a chip according to the present invention.

FIG. 3 shows a result diagram of the circuit delay measurement device measuring 16 paths of a chip according to the present invention. The circuit delay measurement device in the present invention measures 16 paths in Fpmult 64 and gradually adjusts the phase difference between the phase-shifted clock SCLK and the clock MCLK of the combinational logic circuit from 0° to 360° at regular intervals. This process involves a 0-1 transition point and a 1-0 transition point. In FIG. 3, the abscissa indicates the moving phase difference θ and the ordinate indicates the measured path number. FIG. 3 shows that, during actual data acquisition, unstable jitter occurs in the data acquired during the 0-1 transition. In FIG. 3, paths 1, 2, 3 and 13 do not jitter, but all other paths jitter, and path 7 jitters the most. The average phase value of the start and end points of the jitter is taken as the transition point. Taking the 1-0 transition of the path 7 as an example, 0 is acquired for the first time at a phase difference of 44°, 1 is acquired for the last time at a phase difference of 75°, and the data acquired after a 75° phase difference is stabilized to 0. Therefore, (44°+75°)/2=59.5° is taken as the 1-0 transition point of the path 7, $\theta_2'=44$, $\theta_2''=75$, $\theta_2=59.5$. The 1-0 transition point and the 0-1 transition point are basically half a clock cycle apart. The circuit delay measurement device of the present invention can measure the delay of the measured combinational logic circuit, can adapt to all types of data, and can accurately measure the circuit delay under each voltage.

The above described are merely several embodiments of the present invention. Although these embodiments are described specifically and in detail, they should not be construed as a limitation to the patent scope of the present invention. It should be noted that those ordinary skilled in the art may further make several variations and improvements without departing from the conception of the present invention, but such variations and improvements should all fall within the protection scope of the present invention. Therefore, the protection scope of the present invention should be subject to the appended claims.

What is claimed is:

1. A full-path circuit delay measurement device for a field-programmable gate array (FPGA), comprising two shadow registers and a phase-shifted clock, wherein the two shadow registers take an output of a measured combinational logic circuit as a clock and sample the phase-shifted clock as data; the two shadow registers are respectively triggered on a rising edge and a falling edge of the output of the measured combinational logic circuit to sample the phase-shifted clock; outputs of the two shadow registers are delivered by an OR gate as an input into a synchronization register; a clock of the synchronization register serves as a clock of the measured combinational logic circuit; an output of the synchronization register serves as an output of the circuit delay measurement device; the phase-shifted clock and the clock of the measured combinational logic circuit have the same frequency and an adjustable phase difference.

2. A measurement method for the full-path circuit delay measurement device for the FPGA according to claim 1, wherein the measurement method comprises:

gradually adjusting the phase difference between the phase-shifted clock and the clock of the measured combinational logic circuit from 0° to 360° at regular intervals;

allowing, when the phase difference between the phase-shifted clock and the clock of the measured combinational logic circuit is small, a falling edge of the phase-shifted clock to arrive earlier than an edge of the measured combinational logic circuit, wherein the circuit delay measurement device gains a first sampling result of 0;

allowing, when the phase difference between the phase-shifted clock and the clock of the measured combinational logic circuit gradually increases, the falling edge of the phase-shifted clock to arrive later than the edge of the measured combinational logic circuit, wherein the circuit delay measurement device gains a second sampling result of 1, and a transition point from 0 to 1 occurs, indicating that the falling edge of the phase-shifted clock coincides with an output edge of the measured combinational logic circuit;

allowing, when the phase difference further increases, a rising edge of the phase-shifted clock to arrive after the edge of the measured combinational logic circuit, wherein the circuit delay measurement device gains a third sampling result of 0, and a transition point from 1 to 0 indicates that the rising edge of the phase-shifted clock coincides with the output edge of the measured combinational logic circuit;

since a phase of the phase-shifted clock is known, a phase where a sampled value of the circuit delay measurement device is transitioned reflects a positional relationship between the edge of the measured combinational logic circuit and an edge of the phase-shifted clock, thereby indirectly measuring a delay of the measured combinational logic circuit.

* * * * *